(12) United States Patent
Gu

(10) Patent No.: US 11,115,022 B2
(45) Date of Patent: Sep. 7, 2021

(54) SYSTEM AND METHOD FOR INTEGRATED CIRCUIT USAGE TRACKING CIRCUIT WITH FAST TRACKING TIME FOR HARDWARE SECURITY AND RE-CONFIGURABILITY

(71) Applicant: Northwestern University, Evanston, IL (US)

(72) Inventor: Jie Gu, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 1326 days.

(21) Appl. No.: 15/148,700

(22) Filed: May 6, 2016

(65) Prior Publication Data

US 2016/0329897 A1    Nov. 10, 2016

Related U.S. Application Data

(60) Provisional application No. 62/158,113, filed on May 7, 2015.

(51) Int. Cl.
| | |
|---|---|
| *G06F 1/26* | (2006.01) |
| *H03K 3/03* | (2006.01) |
| *H03K 5/24* | (2006.01) |
| *H03K 19/0175* | (2006.01) |
| *H03K 3/356* | (2006.01) |

(52) U.S. Cl.
CPC ....... *H03K 19/017509* (2013.01); *G06F 1/26* (2013.01); *H03K 3/0315* (2013.01); *H03K 3/35613* (2013.01); *H03K 3/356165* (2013.01); *H03K 5/24* (2013.01)

(58) Field of Classification Search
CPC ...... G06F 1/26; G06F 11/3409; G06F 11/008; H03K 19/017509; H03K 3/0315; H03K 3/35613; H03K 3/356165; H03K 5/24
USPC .......................... 702/34, 182, 183, 186, 188
See application file for complete search history.

(56) References Cited

U.S. PATENT DOCUMENTS

| | | | | |
|---|---|---|---|---|
| 4,980,859 A * | 12/1990 | Guterman | .............. | G11C 14/00 365/185.08 |
| 5,204,839 A * | 4/1993 | Lee | ......................... | G11C 16/30 365/204 |
| 5,544,063 A * | 8/1996 | Zanders | ................. | G05B 24/02 257/E27.026 |
| 5,946,204 A * | 8/1999 | Wong | ................... | H03K 17/063 327/108 |
| 6,133,762 A * | 10/2000 | Hill | .................. | H03K 19/09429 326/119 |
| 6,166,583 A * | 12/2000 | Kochi | ....................... | G06F 7/02 327/407 |
| 7,005,871 B1 * | 2/2006 | Davies | ............... | G01R 31/2856 324/750.3 |

(Continued)

*Primary Examiner* — Jeffrey P Aiello
(74) *Attorney, Agent, or Firm* — Benesch, Friedlander, Coplan & Aronoff LLP

(57) ABSTRACT

An accelerated aging circuit is described to shorten the required stress time to a few seconds of operation. Due to the challenges posed by process variation in advanced CMOS technology, a stochastic processing methodology is also described to reduce the failure rate of the tracking and detection. Combining both circuit and system level acceleration, the creation of a silicon marker can be realized within seconds of usage in contrast with days of operation from previously reported aging monitor.

17 Claims, 13 Drawing Sheets

(56) References Cited

U.S. PATENT DOCUMENTS

| | | | | |
|---|---|---|---|---|
| 7,185,042 B1* | 2/2007 | Pasqualini | G06F 7/501 | 708/702 |
| 9,535,473 B2* | 1/2017 | Noorlag | G06F 1/26 | |
| 2001/0008282 A1* | 7/2001 | Maeda | G11C 7/1072 | 257/1 |
| 2001/0033518 A1* | 10/2001 | Ayadi | G11C 29/50 | 365/201 |
| 2004/0125007 A1* | 7/2004 | Pezzini | H03M 1/1076 | 341/155 |
| 2004/0201555 A1* | 10/2004 | Ozawa | G09G 3/3258 | 345/76 |
| 2006/0214901 A1* | 9/2006 | Nagatsuka | G09G 3/3291 | 345/100 |
| 2008/0116455 A1* | 5/2008 | Jain | H03L 1/00 | 257/48 |
| 2011/0164300 A1* | 7/2011 | Shen | G02F 1/0123 | 359/238 |
| 2012/0086130 A1* | 4/2012 | Sasaki | H01L 24/92 | 257/774 |
| 2013/0002327 A1* | 1/2013 | Jain | H03K 19/00315 | 327/214 |
| 2013/0304439 A1* | 11/2013 | Van der Velden | G06F 17/5009 | 703/6 |
| 2014/0035669 A1* | 2/2014 | Moreira | H03F 3/45188 | 330/253 |
| 2014/0084974 A1* | 3/2014 | Tang | H03L 7/0891 | 327/154 |
| 2014/0123085 A1* | 5/2014 | Shroff | G06F 17/5072 | 716/102 |
| 2014/0266307 A1* | 9/2014 | Goldblatt | H03K 5/00 | 327/50 |
| 2014/0266386 A1* | 9/2014 | Huang | H03K 3/012 | 327/333 |
| 2014/0285695 A1* | 9/2014 | Yamamoto | G02B 1/04 | 348/294 |
| 2015/0022264 A1* | 1/2015 | Kim | G11C 29/46 | 330/2 |
| 2015/0042689 A1* | 2/2015 | Kim | H03K 3/012 | 345/690 |
| 2015/0093910 A1* | 4/2015 | Tan | G06F 17/5072 | 438/761 |
| 2015/0100608 A1* | 4/2015 | Varadarajan | H03K 19/17764 | 708/190 |

\* cited by examiner

SYSTEM AND METHOD FOR INTEGRATED CIRCUIT USAGE TRACKING CIRCUIT WITH FAST TRACKING TIME FOR HARDWARE SECURITY AND RE-CONFIGURABILITY

CROSS-REFERENCE TO RELATED APPLICATIONS

This patent application claims the benefit of U.S. Provisional Patent Application No. 62/158,113, filed on May 7, 2015, the entire contents of which is incorporated by reference in its entirety.

BACKGROUND

Complementary metal oxide semiconductor (CMOS) is a type of semiconductor. CMOS semiconductors can use both NMOS (negative polarity) and PMOS (positive polarity) circuits. Since only one of the circuit types is on at any given time, CMOS chips require less power than chips using just one type of transistor. This makes CMOS semiconductors attractive for use in battery-powered devices, such as portable computers. Personal computers also contain a small amount of battery-powered CMOS memory to hold the date, time, and system setup parameters.

DESCRIPTION

Figure 1:
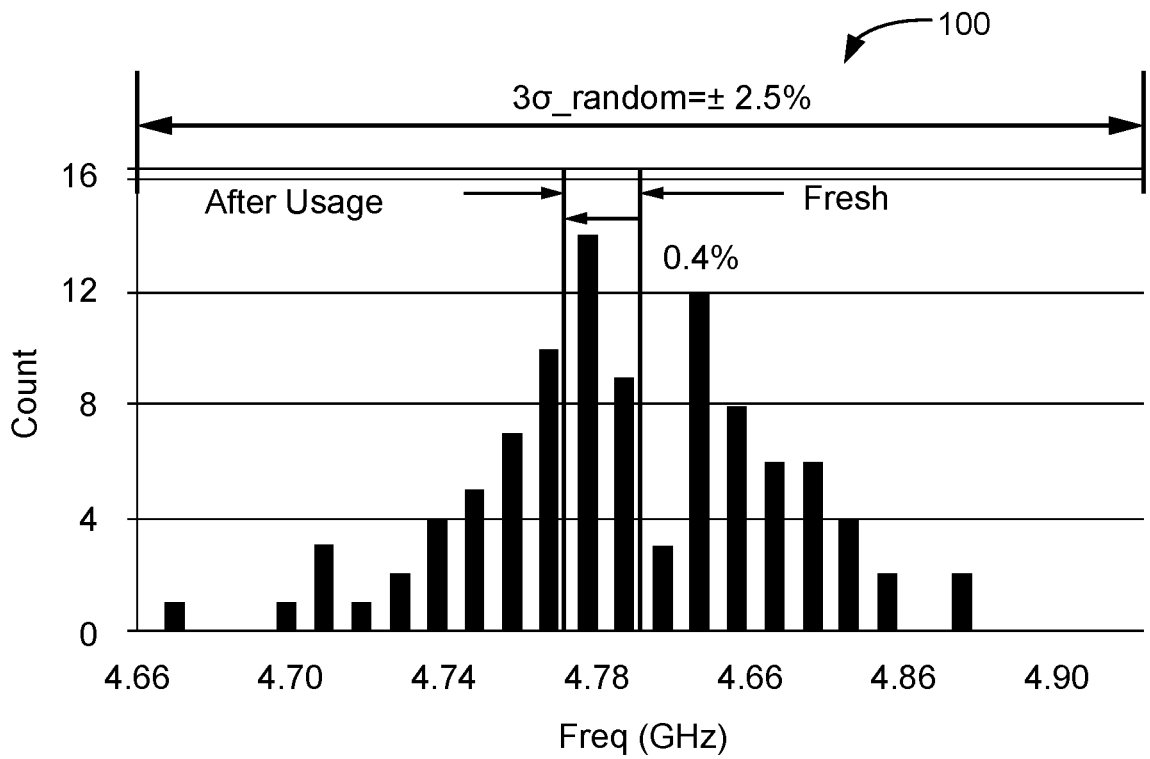
FIG. 1 is a graph showing a speed degradation of an 11-stage ring oscillator circuit under about ten seconds of stress in a cold temperature in comparison with the random process variation impact.

The rapid development and vast integration of silicon complementary metal oxide silicon (CMOS) technology has posed new challenges to integrated (IC) designers, e.g., the control of the usage of the chip. Due to process limitation of conventional CMOS technology, there is a lack of technique to assist a fast and accurate tracking of the silicon usage, e.g., for security related applications. Previous silicon aging monitoring circuit requires days of operation to establish a reliable detection. To enable a fast tracking of the chip operation and provide a usage dependent re-configurability, a silicon marker technique is described using only conventional CMOS devices. An accelerated aging circuit is described to shorten the required stress time to a few seconds of operation. Due to the challenges posed by process variation in advanced CMOS technology, a stochastic processing methodology is also described to reduce the failure rate of the tracking and detection. Combining both circuit and system level acceleration, the creation of a silicon marker can be realized within seconds of usage in contrast with days of operation from previously reported aging monitor.

The continuous scaling of CMOS technology allows more functionality to be integrated into a single chip. Although the vast integration brings a benefit of the cost reduction and performance enhancement, the need of efficient tracking and controlling the usage of a large system-on-chip (SOC) IC have become a pressing challenge. Examples of the applications that require effective tracking of the chip usage include commercial ICs that are enforced by restricted lifecycles, such as an evaluation version of the chip that is disabled after a few trials; High performance ICs under export control that is disabled after several usage to avoid unauthorized handling; Recycled chips that need to be detected and prevented from flowing into markets; Chips that may need user reconfiguration after its usage. Until now, the above tasks have not been cost-efficiently realized in conventional CMOS technology because of the lack of real-time programmable non-volatile device which is alternatively offered from emerging devices such as Spintronic based SRAM or MTJ devices. However, as the hardware security has become one of the most critical requirements in modern electronic design, such efficient tracking circuits have become indispensable. The description explores a creation of an energy and cost efficient hardware tracking circuit using conventional CMOS technology without special technology enhancement.

A silicon aging monitor is described to track the usage of the standard CMOS device. The silicon aging monitor normally includes two ring oscillator circuits with one used as a reference and the other one to detect the stress time. Although such a circuit can provide information on the previous usage of the chip, there are a few major limitations from previously reported CMOS aging monitor circuits. The silicon monitor circuit based on natural aging is not able to reliably monitor a very short-term operation where a single usage can be finished within seconds to minutes of operation. A study on detection of recycled ICs shows a minimum three to fifteen days of stress is needed to create a reliable detection from a ring oscillator based CMOS aging sensor due to the slow development of silicon aging effect and large process variation.

FIG. 1 is a graph 100 showing a speed degradation of an 11-stage ring oscillator circuit under about ten seconds of stress in a cold temperature in comparison with the random process variation impact. For example, aging degradation of ten seconds in 0° C. temperature compared with intrinsic mismatch impact in 45 nm PTM CMOS technology. A Monte-Carlo simulation with 4% random threshold voltage variation is applied. A minimum of 8 hours continuous stress can be used to overcome the mismatch impact. The ever-increasing random mismatch in advanced CMOS technology can overwrite the aging effect under only a few seconds of stress. To overcome the mismatch impact, a more than 8 hours continuously DC stress without recovery is required based on an optimistic analysis. Secondly, for a fresh chip, the comparison output between a reference unstressed circuit, e.g. RO and the stressed circuit is random. Therefore, a clear distinction methodology is described to obtain decisive results on the usage of the chip. The existing aging monitors do not provide the required fast and deterministic tracking results as needed.

To enhance memory creation from the CMOS technology, technology extensions have been built to enable storage and reconfiguration of the fabricated chips such as anti-fuse, floating gate device and EPROM. Anti-fuse techniques require a high voltage and high current to create an oxide breakdown, e.g. larger than 4V as reported in a 45 nm technology. Such a requirement requires high voltage device, special operating configuration and supporting circuitry to establish the programming function. Meanwhile, the use of floating gate device or other flash based memory cell increases the manufacturing cost of the chip.

Physically unclonable function (PUF) circuits have been described to create secret codes that are needed for hardware security encryption. Stochastic properties can be used to enhance the robustness of the generation of random numbers. The usage of latch based comparator circuit provides a low power cost efficient way for mismatch detection.

A latch based comparator circuit is described to detect the aging of the device. The description is summarized below: (1). An aging accelerating circuit is described to create a silicon marker during real-time operation within only a few seconds of operation. For embedded usage, all the supportive transistors in the described design are core transistors operating without overstress. (2). A stochastic processing methodology is described to ensure the detection accuracy with tolerance to process variation.

Controlled Reliability Effect

To realize a marking technique in a conventional CMOS device, the reliability degradation in modern CMOS transistors provides a potential solution. The reliability effects include hot carrier injection (HCI), negative-bias temperature instability (NBTI), and time-dependent gate oxide breakdown (TDDB), etc. Extensive study has been performed to model the degradation from each of the effects. Although all three effects can be used to track the operation of the circuits, a few practical considerations are evaluated, e.g. power and cost. To create an accelerated HCI effect in a NMOS transistor within a short period of time, a substantially large current is delivered through the transistor leading to a large power consumption and reliability consideration of supporting circuits and wires. To enhance TDDB effect, a large on-chip voltage, e.g., 4V is generated and safely delivered onto the device under test. Such an operation includes more hardware costs and high voltage devices. Given both power and cost consideration, NBTI is used in the description as the basic effect to create the silicon marker circuits. However, NBTI can suffer from drawbacks of recovery as well as temperature dependency. Such drawback reduces the impact of NBTI and degrades the detectability of the described circuits under large process variation. To overcome the deficiency of NBTI stress effect, a stochastic based design methodology is described below. To correctly model the NBTI stress effect, an equation shown in (1) is used to simulate the impact of voltage, duration, temperature and recovery.

$$\Delta V_{th} = A \cdot t^n \cdot V_{stress}^m \cdot (1 - \eta^{0.5}) \cdot e^{\left(-\frac{nE_a}{kT}\right)} \quad (1)$$

where A, m is a curve fitting coefficient from previous measurement data, n is power-law time exponent, η is recovery coefficient and Ea is the activation energy. The equation is calibrated based on the reported NBTI measurement in a commercial 45 nm technology using the curve fitting coefficient reported in. The recovery in equation (1) is based on previous analysis and assumes a recovery of 60% (η=0.35). The temperature dependency is also derived based on a widely used reaction-diffusion model referring to previous analysis in a 45 nm technology.

Figure 2A:
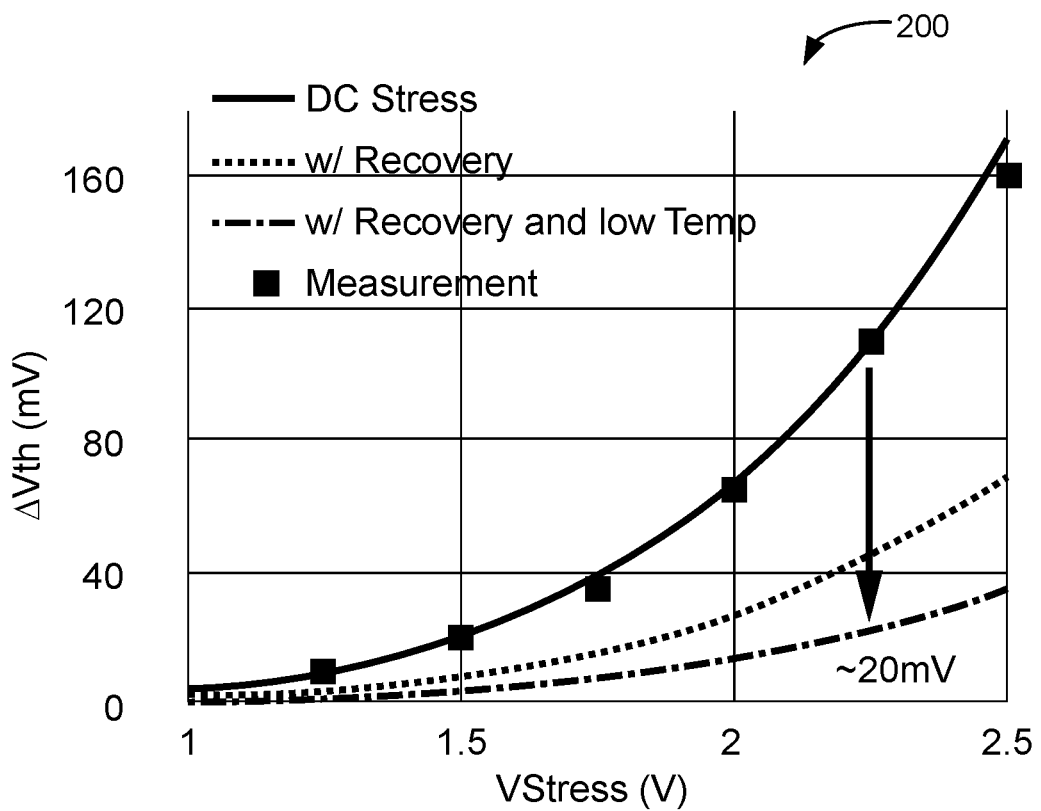
FIGS. 2A and 2B are graphs showing a simulation results of the NBTI effect: $\Delta V$ versus stress and time, respectively.
Figure 2B:
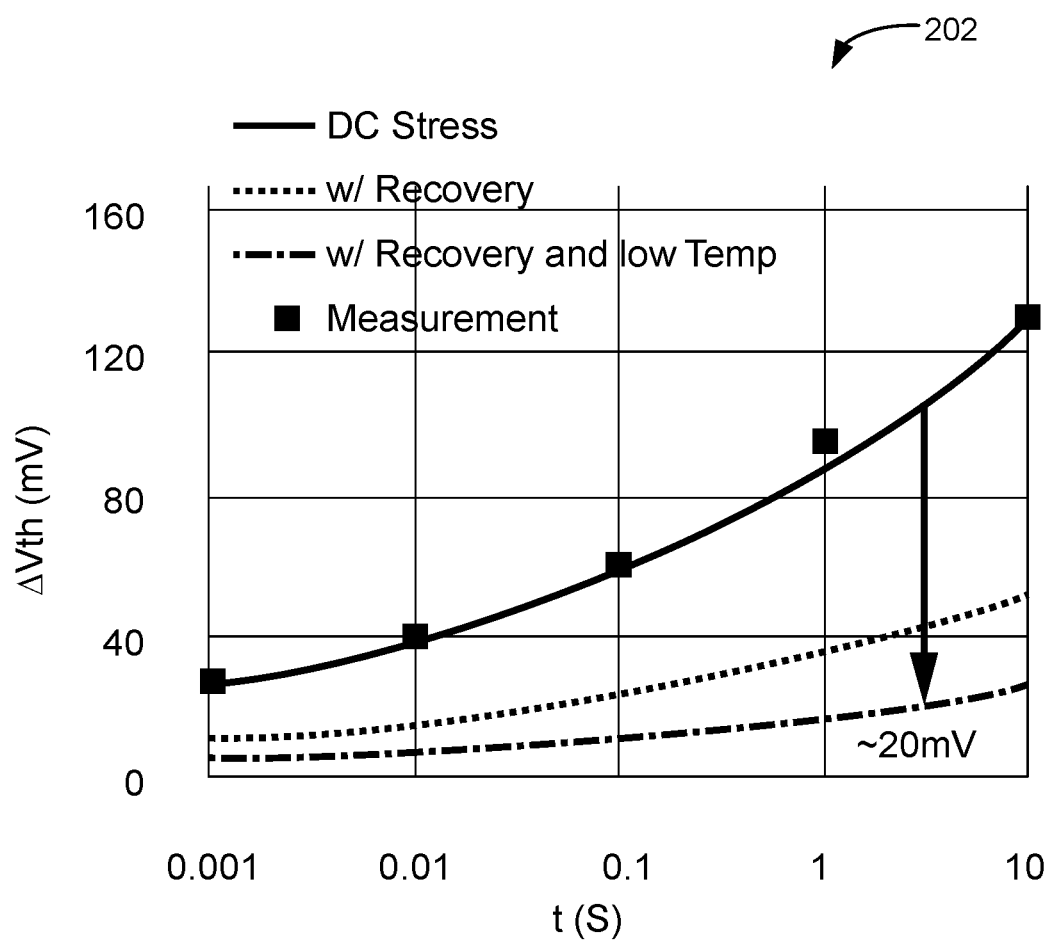

FIGS. 2A and 2B are graphs 200, 202 showing a simulation results of the NBTI effect: ΔV versus stress and time, respectively. Considering recovery and temperature dependency, a reduction of ~5× from the initial Vth shift has been seen at the worst case condition, e.g. low temperature (0° C.) and DC recovery. As a result, a target minimum stressing voltage of 2.2V and a worst case Vth shift of 20 mV in a minimum of 2 seconds of stress is assumed for application of fast tracking chip usage.

Using NBTI can require a high voltage generator from charge pump circuits leading to large area cost. For purpose of fault recovery where localized standard cell-like circuits are to be used, small area costs are more desired. Therefore, HCI effects are described below for application of fault/defect recovery to reduce the silicon costs. The HCI model is based on measurement in a commercial 45 nm technology using the curve fitting coefficient and previous simplified HCI equation model in equation (2) below:

$$\Delta V_{th} = A \cdot \frac{q}{C_{ox}} K \cdot \sqrt{C_{ox}(V_{GS} - V_{th})} \cdot e^{\left(\frac{E_{ox}}{E_0}\right)} \cdot e^{\left(-\frac{\varphi_{it}}{q\lambda E_m}\right)} \cdot t^n \quad (2)$$

where A is a fitting coefficient, n (=0.4) is power-law time exponent, $E_{ox}=(V_{gs}-V_{th})/T_{ox}$, $E_m=(V_{ds}-V_{dsat})/L$, $C_{ox}=(\varepsilon_{ox})/T_{ox}$, and the other parameters described in Wenping Wang, et al., "Compact Modeling and Simulation of Circuit Reliability for 65-nm nm CMOS Technology," IEEE Transactions on Device and Material Reliability, vol. 7, no. 4, December 2007. From measurement data, analytical model and spice simulation, an equivalent of 10~20 mV Vth shift is introduced for 1-3 minutes of stress and 1.4V supply as shown in FIGS. 2C and 2D. The fitting model versus measurement data is also shown in the FIG. 2.

Although the description uses a fitted model in 45 nm to quantify the aging effects which can vary from technology to technology, the circuit and system techniques can be generalized independent of process nodes. The technology development in more advanced nodes continues to ease the design of aging accelerator circuits because aging effects become stronger at newer technology nodes. As a result, the description provides a general design framework which can be applied to other technology given specific aging models characterized at a particular technology.

Latch-Based Aging Accelerator Circuit

To enhance the aging effect on a core PMOS transistor, an elevated voltage is applied to the gate the PMOS transistor for a short period of time to induce controlled NBTI effects. Three challenges can be considered in the design of the aging accelerator circuits: (1) No transistor except the target aging transistor can experience an accelerated stress; (2) The mismatch impact of the supporting transistors can be minimal on the comparison results; (3) The circuit can be protected from aging during normal operation once the detection is finished after chip is powered up.

Figure 3:
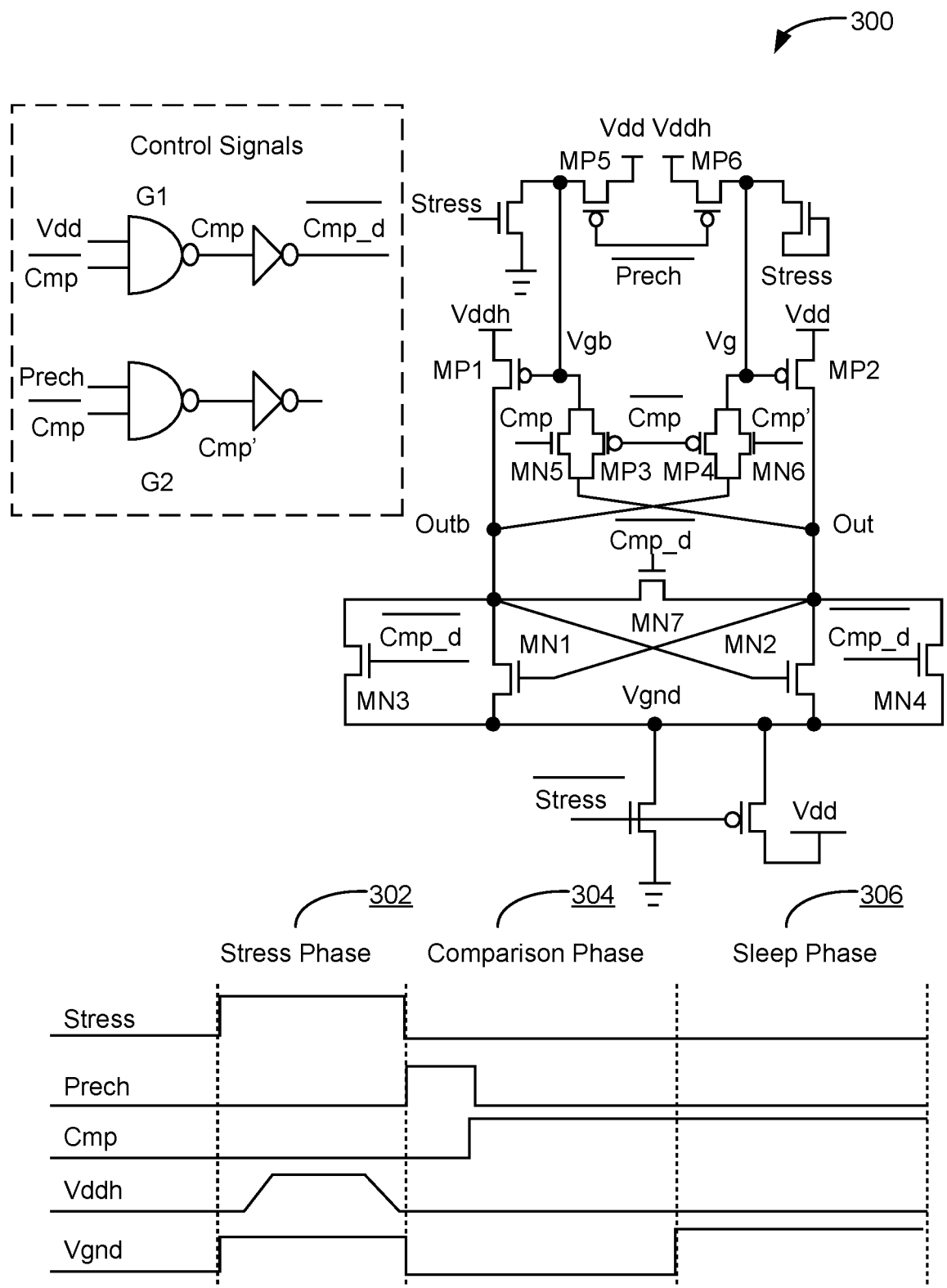
FIG. 3 is a schematic of an example latch circuit based aging accelerator cell and its operating modes.
Figure 4A:
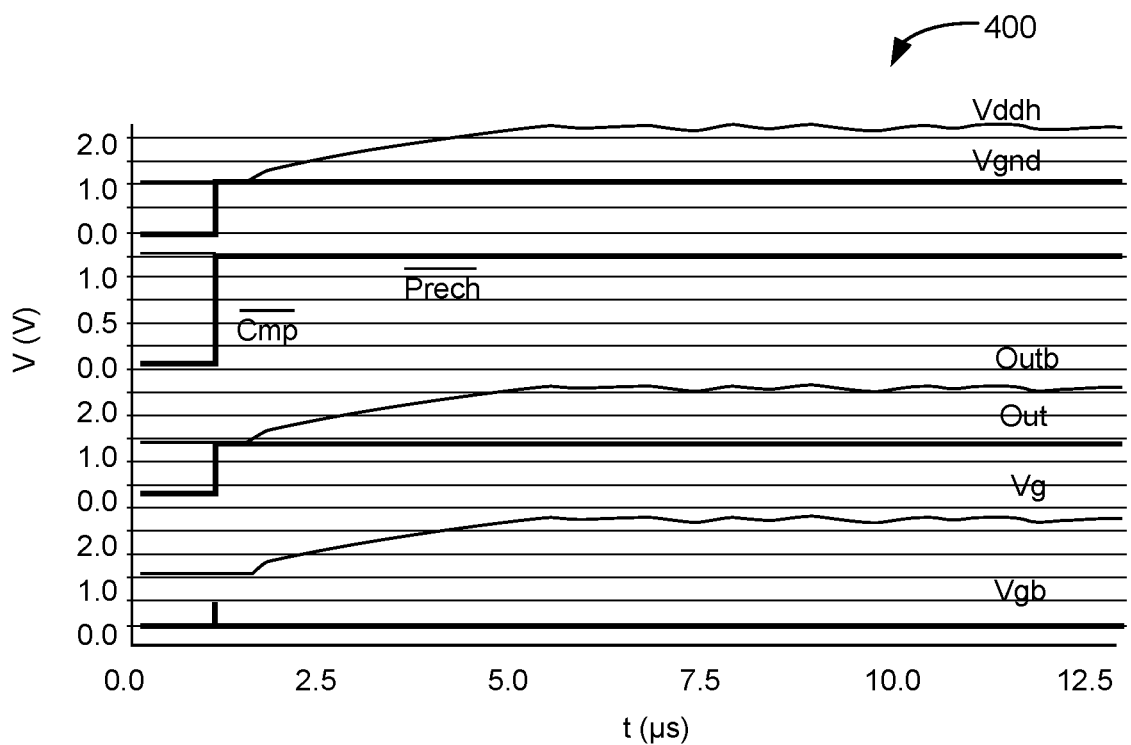
FIGS. 4A and 4B are graphs of example simulated corresponding signal waveforms stress and comparison phases.
Figure 4B:
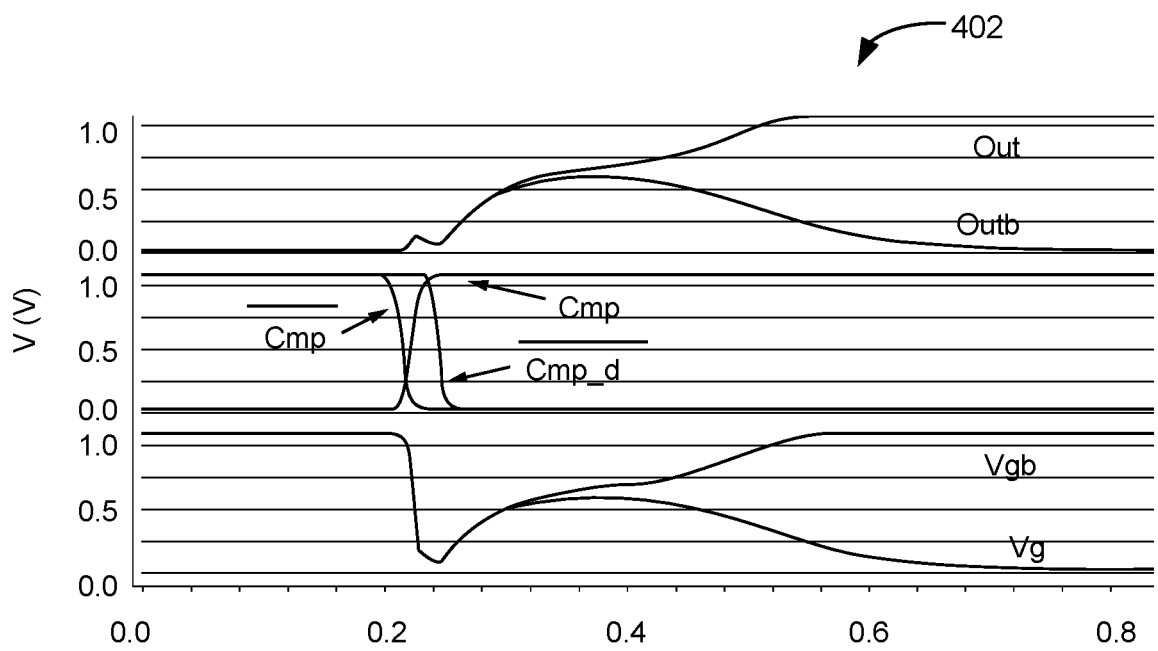

FIG. 3 is a schematic of an example latch circuit 300 based aging accelerator cell and its operating modes. FIGS. 4A and 4B are graphs 400, 402 of example simulated corresponding signal waveforms stress and comparison phases. During stress phase 302, the source voltage of MP1 is lifted to the target voltage Vddh around 2.2V while the gate is grounded (it is within the oxide breakdown limit for a short period time). Because MP1 is turned on in the configuration, the Vddh is also applied to the gate of MP2 and the NMOS device MN1-3. To avoid stress to be created, the internal virtual ground of the latch Vgnd is lifted to internal voltage Vdd so that no elevated stress falls on any of the supporting transistors except MP1. Two transmission gates are added to the gate nodes of MP1 and MP2 to isolate the gate of MP1 from the rest of the circuits to execute stress without creating tension on other devices. To avoid stress on the transmission gates, both the body and the gate (signal Cmp') of the MN6 is also switched to Vdd during stress phase. As a result, all transistors are well protected without overstress between any two terminals.

After stress phase 302, the target voltage Vddh is returned back to the internal voltage Vdd to perform a threshold voltage comparison between MP1 and MP2. Before the comparison phase 304, the Vgnd is first released to ground. Then the out and outb are precharged to ground by MN3 and MN4 while the MP1 and MP2 are turned off from MP5 and MP6 to avoid short-circuit currents. Upon finishing the precharge of MP1 and MP2, the transmission gates (MN5/MN6 and MP3/MP4) are turned on and the transistors MN3 and MN4 are turned off to release the latch output Out/Outb from ground. The speed of rising of the nodes Out and Outb depends on the strength of MP1 and MP2 and thus establish a comparison of transistor threshold voltages. During the comparison phase 304, the mismatch from three supporting pairs of transistors also impact the output of the latches, e.g. MN1/MN2, MN3/MN4, transmission gates MP3/MN5 and MP4/MN6. To minimize the impact of MN3 and MN4, a shorting transistor MN7 controlled by the release signal of MN3 and MN4 is placed between Out and Outb to remove the influence from the MN3 and MN4 at the time the comparison is issued. Because the outputs are pre-charged to ground at the release of the latch, the impact from MN1 and MN2 is much smaller than MP1 and MP2. Besides, longer channel length (100 nm) can be used for MN1 and MN2 to reduce their impact on the comparison. The size of MP1 and MP2 is chosen to be 1 µm/50 nm to dominate the comparison. The RC delay from the transmission gates are much smaller than the comparison speed of the latch and thus their device mismatch impact from the transmission gates is also minimal. To fully characterize the mismatch impacts from the transistors, internal mismatch can be generated into each transistor to perform a simulation. The mismatch impact of each transistor is compared with the target transistors MP1 and MP2 as shown in Table 1.

TABLE 1

Sensitivity to mismatch for transistors used in the latch.

| | Transistor | | | | |
|---|---|---|---|---|---|
| | MP1 &MP2 | MN1 &MN2 | MN3 &MN4 | MN5&MN6 &MP3&MP4 | G1 &G2 |
| Sensitivity | 1 | 0.11 | 0.1 | 0.03 | <0.01 |

For example, to overwrite 1 mV mismatch from MP1 and MP2, 9 mV mismatch (normalized to the same size) is present in MN1 and MN2. The mismatch impact from all supporting transistors can be lumped into an external random noise term to quantify the disturbance it generates to the detection accuracy. Details are described below. Note that all the control signals are common to MP1 and MP2 except Cmp and Cmp' whose impact is also characterized. After the comparison phase 304 the circuit can enter a sleep phase 306.

Charge Pump Based Voltage Generator and Whole System

An internal generated stress voltage is needed because the supply voltage may observe variation and the users may intentionally drop the supply voltage. Therefore, a simple voltage doubler may not work for the target application. A charge pump with feedback control is described in the work to establish a well-controlled stress condition for the device.

Figure 5A:
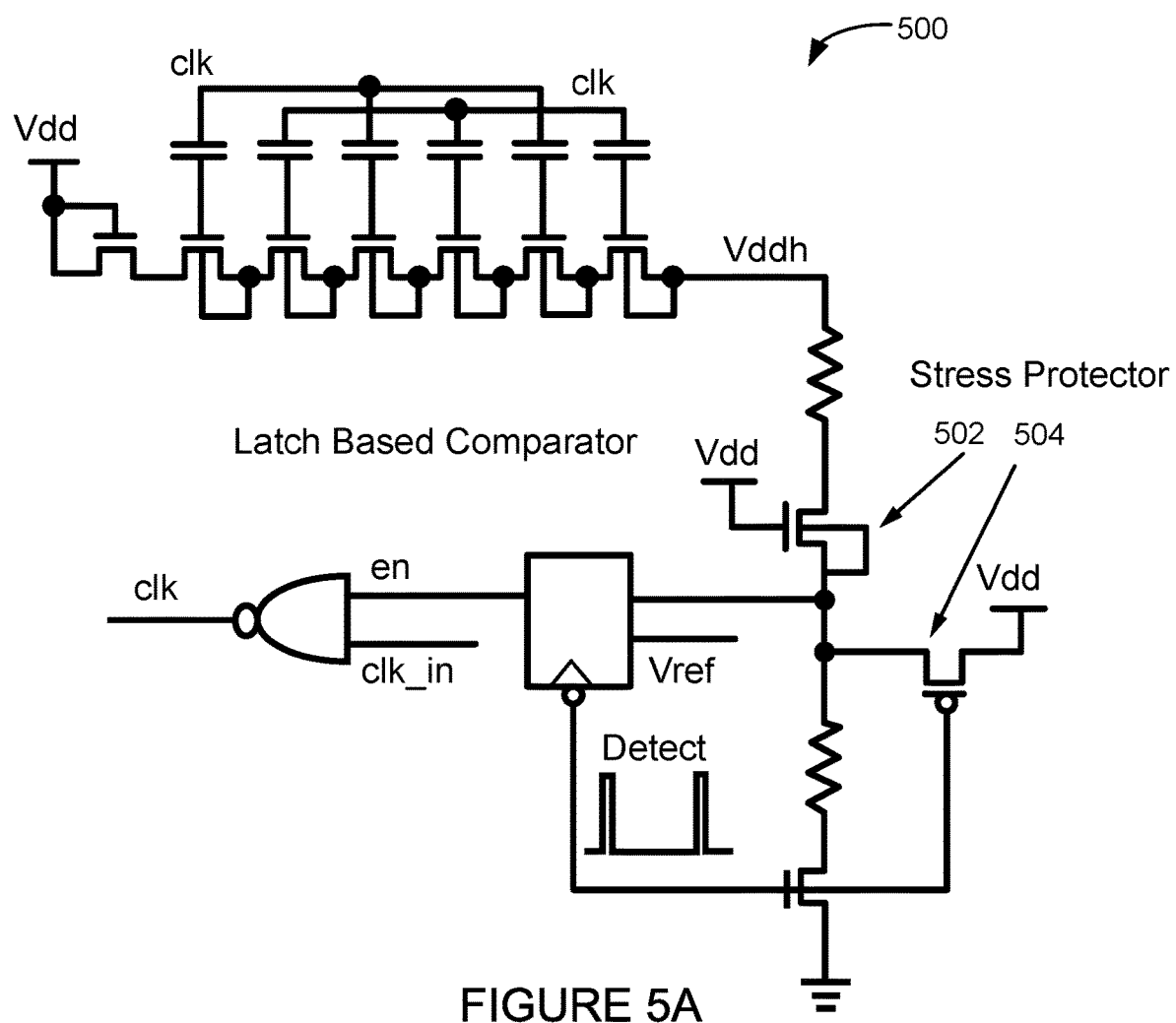
FIG. 5A is a voltage generator circuit based on Dickson charge pump with feedback loop to monitor the output voltage.

In FIG. 5A, a voltage generator circuit 500 can be based on Dickson charge pump with feedback loop to monitor the output voltage. Core transistor is used and no voltage stress over Vdd is generated onto the transistors 502, 504. Because during high stress period only leakage currents (subthreshold leakage and gate leakage) flow through Vddh, the charge pump only needs to support a small current flow, e.g. around 1 µA in the worst case simulation. As a result, the number of stages and capacitance values (~0.5 pF) are minimized to reduce the area cost.

Figure 5B:
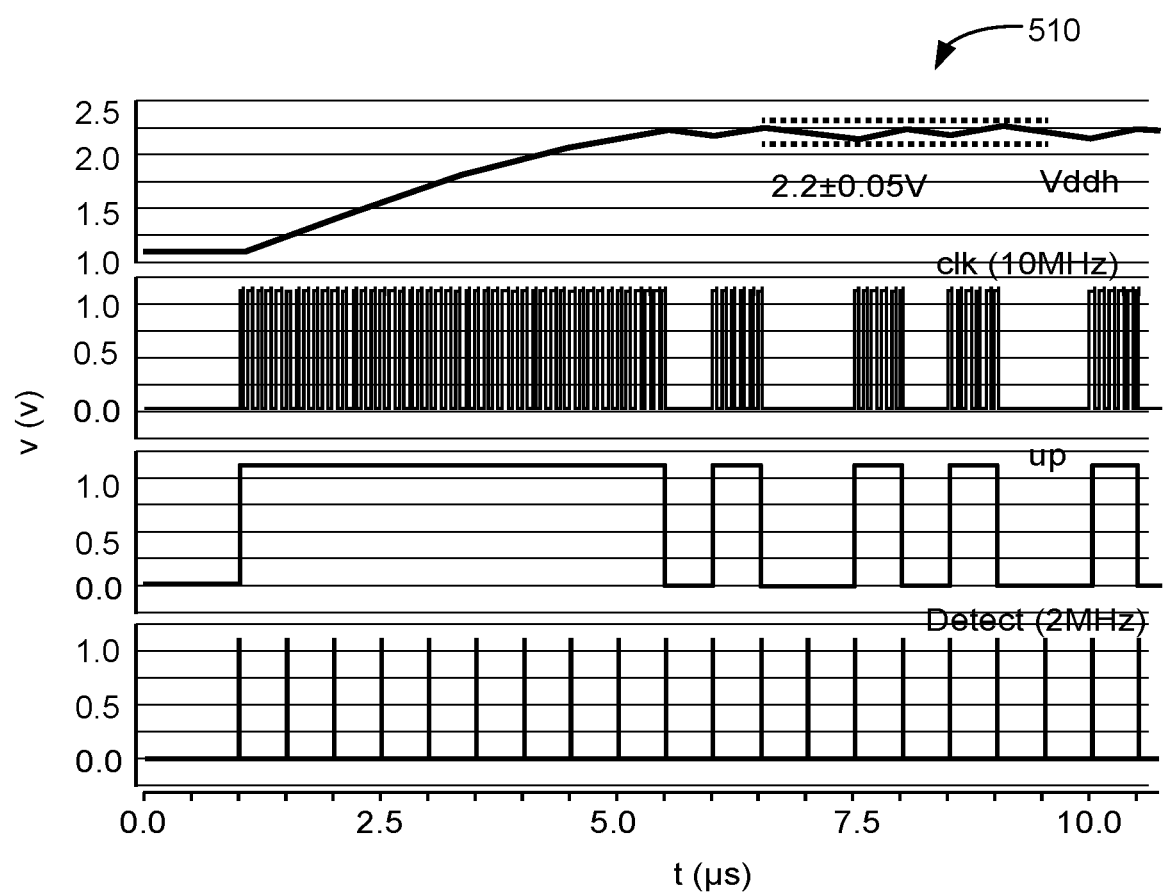
FIG. 5B is a graph of example simulated voltage waveforms during the operation of the voltage generator circuit.

FIG. 5B is a graph 510 of example simulated voltage waveforms during the operation of the voltage generator circuit 500. Note that to reduce the current drawn to the Vddh from the resistor divider which provides feedback voltage to the voltage comparator, the activation of the comparator and resistor ladder is activated with only 3% duty cycle with a 2 MHz monitoring clock. A low duty cycle and low clock frequency helps reduce the current that the charge pump needs to support leading to reduced size of the voltage generator. Due to the low duty cycle, a voltage ripple is observed in the stress voltage. In the case, a voltage ripple of ±50 mV is observed which does not create significant variation on the stress time because the average output voltage is maintained the same.

Figure 6A:
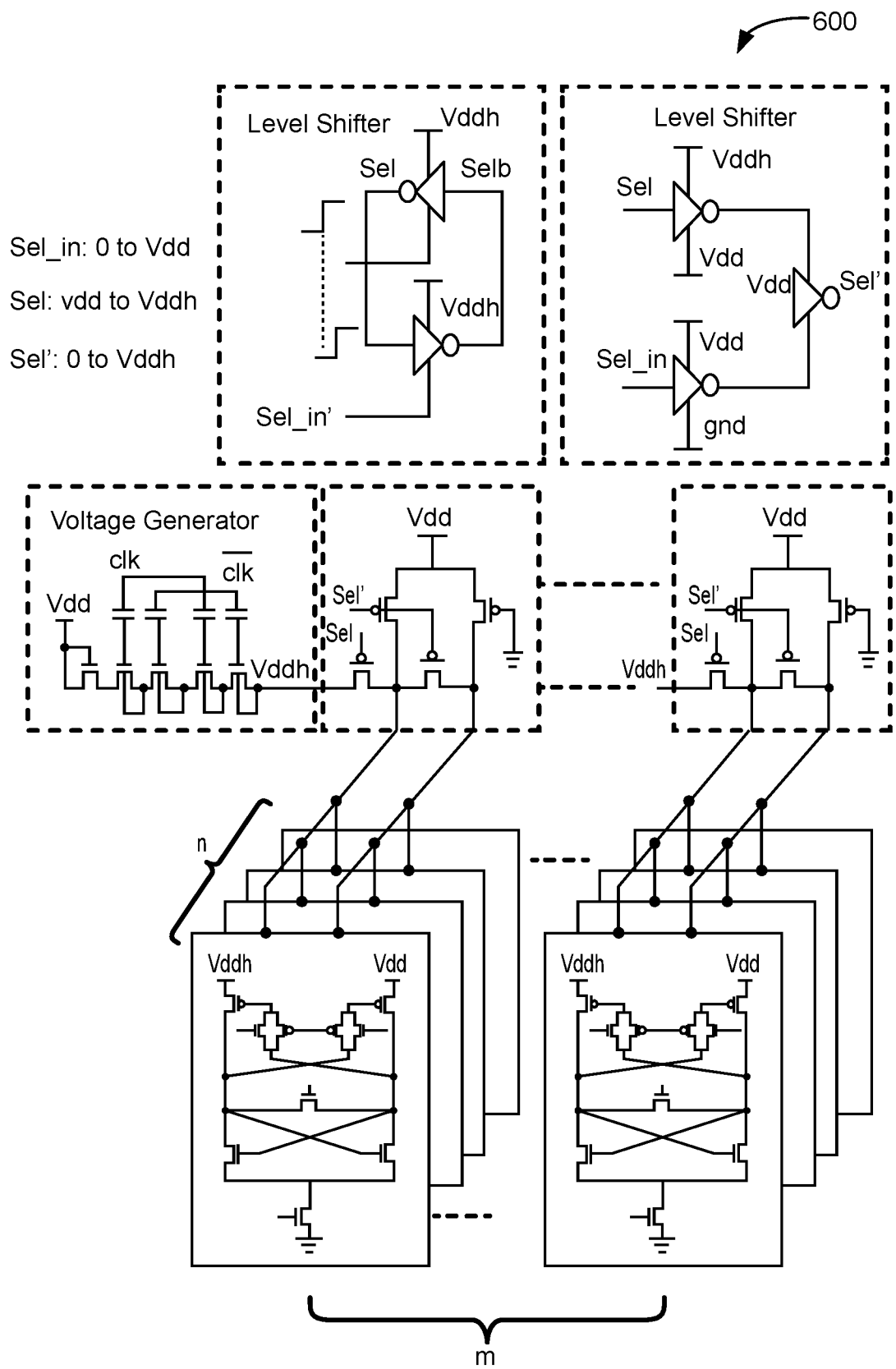
FIG. 6A shows an overall system level diagram of the silicon marker circuits.
Figure 6B:
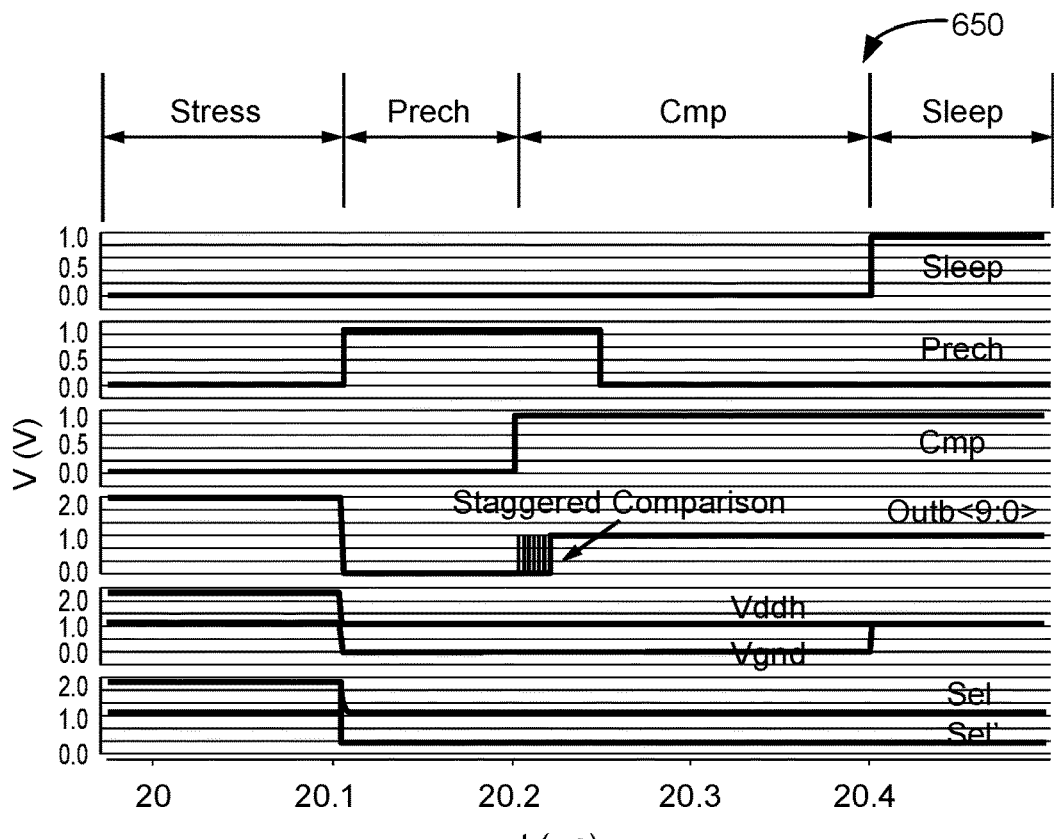
FIG. 6B is a graph showing the simulated waveform during a complete operation cycle.

FIG. 6A shows an overall system level diagram 600 of the silicon marker circuits. A balanced power switch, e.g., level shifter circuits, is used to connect Vddh to internal Vdd during comparison phase 304. The comparison operations of multiple latch cells are staggered to eliminate the interference through power supply among the cells during comparison. Simulation can verify that the interaction among cells as well as the mismatch of the power switch has negligible impact to the output of the latch cells. FIG. 6B is a graph 650 showing the simulated waveform during a complete operation cycle.

Stochastic Processing for Variation Tolerance

A. Stochastic Processing Methodology

Even though a noticeable threshold voltage shift has been created through the accelerator circuit, two challenges can exist. First, the use of a single binary bit output from a latch cell can be insufficient to distinguish a fresh IC from a used IC as the binary output from a fresh IC is random and thus cannot provide sufficient information to determine whether the chip has been used. Second, the enhanced threshold voltage shift introduced from the elevated stress shown may not be sufficient to guarantee a high yield. For example, with a threshold voltage shift of 21 mV, one out of twenty chips can fail the detection. Combining the two issues above, a stochastic based processing methodology is described to improve a reliability of the detection. If a single cell is not able to provide sufficient information on the chip usage, the stochastic output of multiple latched based cells can be used.

Figure 7:
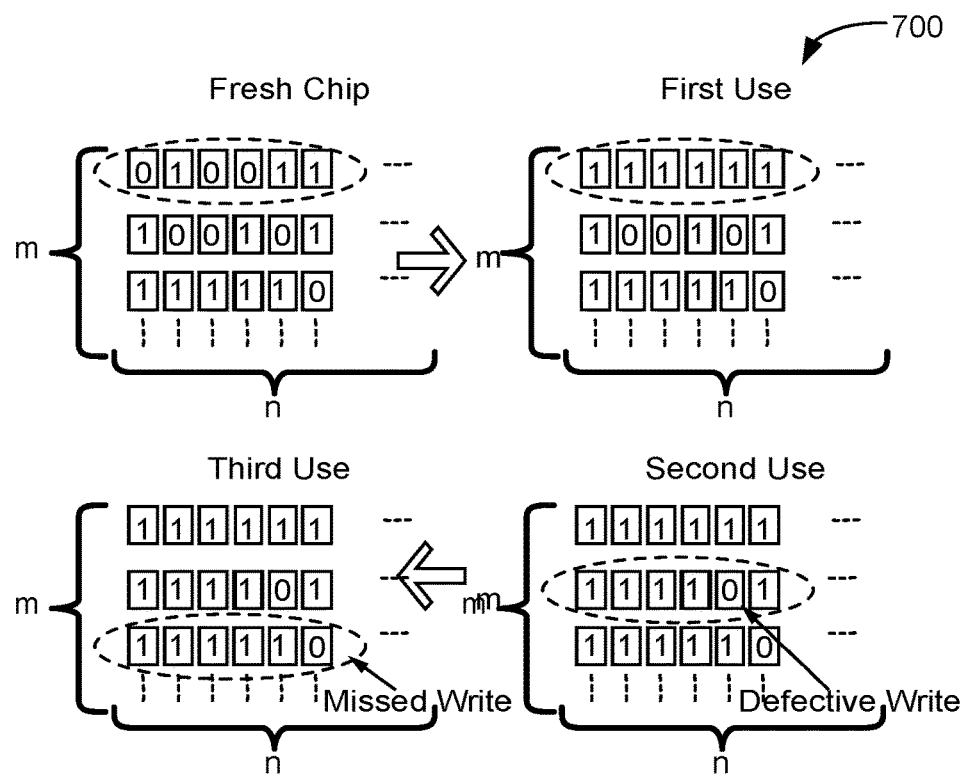
FIG. 7 is a flow diagram of an example stochastic processing methodology.

FIG. 7 is a flow diagram of an example stochastic processing methodology. An array of m×n cells are deployed on the chip. A set of n cells are stressed simultaneously each time the chip goes through a reboot from a Power-on-Reset (POR) circuit. Totally m times reboot can be tracked depending on the need of the application. After each reboot, a fresh row of n cells are selected to be stressed. After stress, the n cells ideally display outputs of all "1", or other uniform output indicator, compared with an unstressed situation where the number of "1"s is random. By counting the number of "1"s at the output, the usage of the chip can be detected. However, the on-chip mismatch introduces substantial noise into the comparison. As a result, a stressed chip may not observe all "1" at the n bits output if any of the cells observes more mismatch than the induced threshold voltage shift. To deal with the significant mismatches, the detection rule can be relaxed to allow t numbers of faulty output "0" and still consider the chip has been stressed. The relaxation leads to an optimization problem from two failure scenarios. (1). An unstressed chip happens to exhibit an output pattern with less than or equal to t of "0"s. Such a chip is mistakenly considered to be stressed. The chip is referred to as a missed chip. (2). A stressed chip with more than t cells with larger mismatch than the introduced Vth shift. Such a chip cannot be stressed into the final pattern, e.g. less than t numbers of "0"s. The chip is referred to as a defective chip. The sum of scenarios (1) and (2) gives the total failure rate of the detection. The rates from missed chip and defective chip can be formulated as bellow.

The miss rate for a tolerance of s incorrect bits for a total of n bits is:

$$MR(s) = \frac{C(n,s)}{2^n} = \frac{n \cdot (n-1) \cdot (n-2) \ldots (n-s)}{s! \cdot 2^n} \quad (3)$$

where C(n, s) is the combination formula.

Total miss rate for a maximum t incorrect bits is given by:

$$MR_{all} = \Sigma_{s=0}^{t} MR(s) = \Sigma_{s=0}^{t} C(n,s)/2^n \quad (4)$$

The standard deviation of mismatch between two PMOS transistors is given by $\sigma_0$. If the rest of circuits introduces an additional effective mismatch given by $\sigma_1$ as evaluated, the total equivalent mismatch can be found by $\sigma_2^2 = \sigma_0^2 + \sigma_1^2$. From $\sigma_2$, find the possibility (denoted by p) of a large mismatch of all the transistors exceeding the NBTI threshold shift based on the cumulative distribution function (CDF) of a Gaussian distribution. Thus, the defective rate for s bits of faulty outputs is:

$$DR(s) = p^s \cdot (1-p)^{n-s} C(n,s) \quad (5)$$

$$= p^s \cdot (1-p)^{n-s} \cdot \frac{n \cdot (n-1) \cdot (n-2) \ldots (n-s)}{s! \cdot 2^n}$$

Total defective rate for a tolerance of t incorrect bit is given by:

$$DR_{all} = \Sigma_{s=t+1}^{\infty} DR(s) = \Sigma_{s=t+1}^{\infty} p^s (1-p)^{n-s} C(n,s) \quad (6)$$

Note that the summation starts from t+1 because the faulty number of bits equal to t or less are considered first to be a successful write. Thus, the total failure rate for n bits with a t bits tolerance is given below:

$$FR = MR_{all} + DR_{all} \quad (7)$$

$$= \sum_{s=0}^{t} C(n,s)/2^n + \sum_{s=t+1}^{\infty} p^s (1-p)^{n-s} C(n,s)$$

For a chosen number of n cells, the failure contribution from missed cells and defective cells show an opposite trend leading to an optimum solution for the value of t.

Figure 8A:
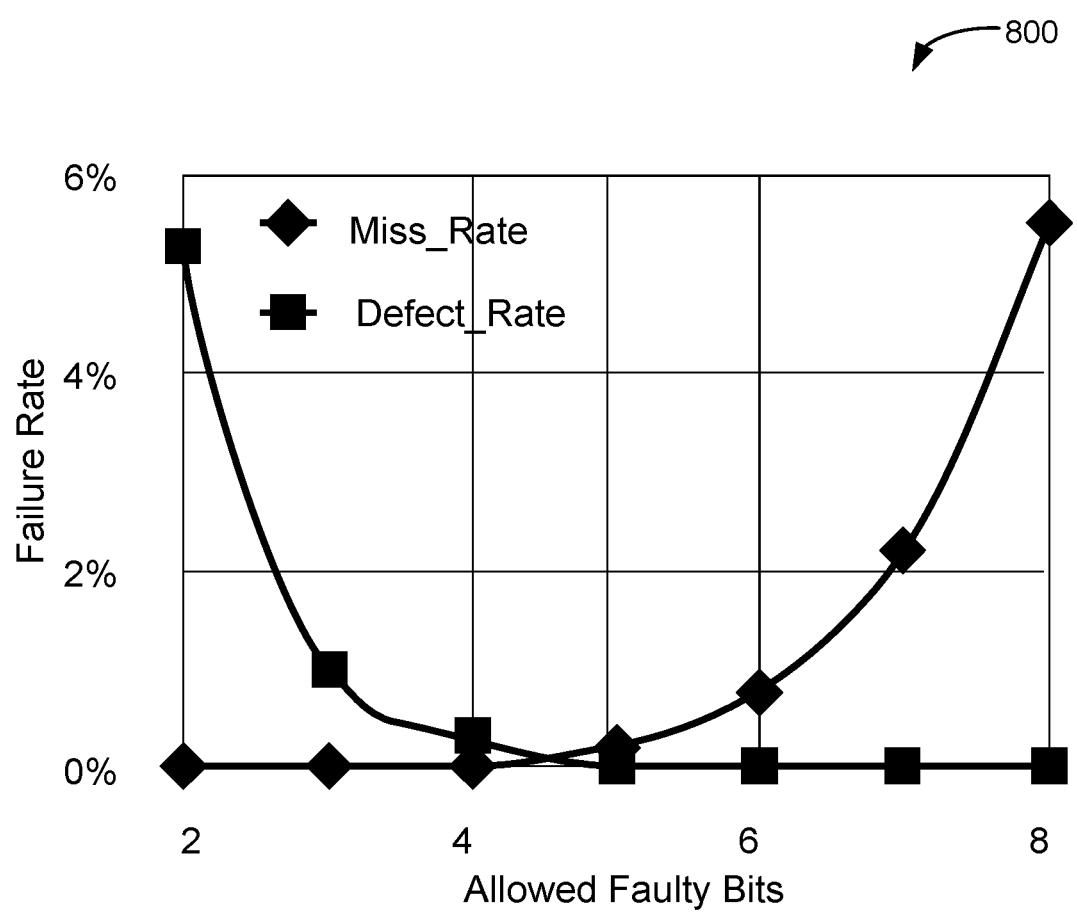
FIGS. 8A and 8B are graphs illustrating the miss rate, defective rate, and total failure rate versus the allowable number of faulty output t with n=25 (25 cells) based on Monte-Carlo simulation of 10,000 chips.
Figure 8B:
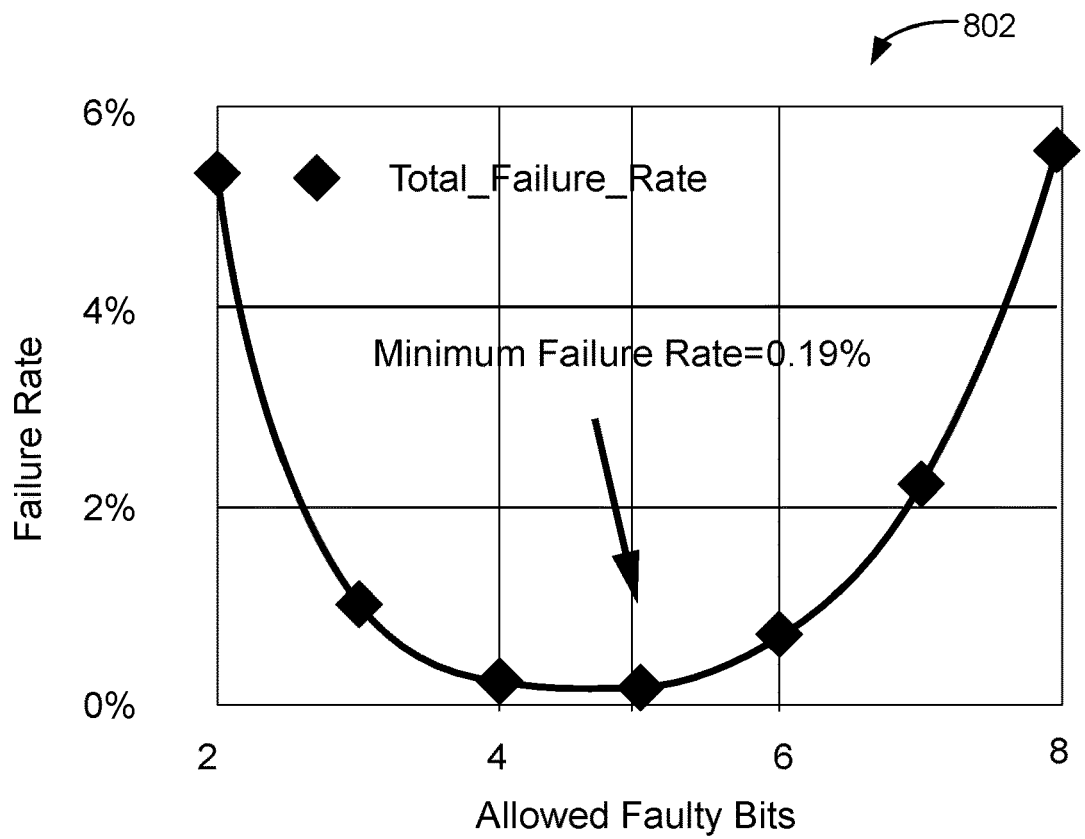

FIGS. 8A and 8B are graphs 800, 802 illustrating the miss rate, defective rate, and total failure rate versus the allowable number of faulty output t with n=25 (25 cells) based on Monte-Carlo simulation of 10,000 chips. It is illustrated that an optimum value of t exists to provide the minimum failure rate.

Figure 9:
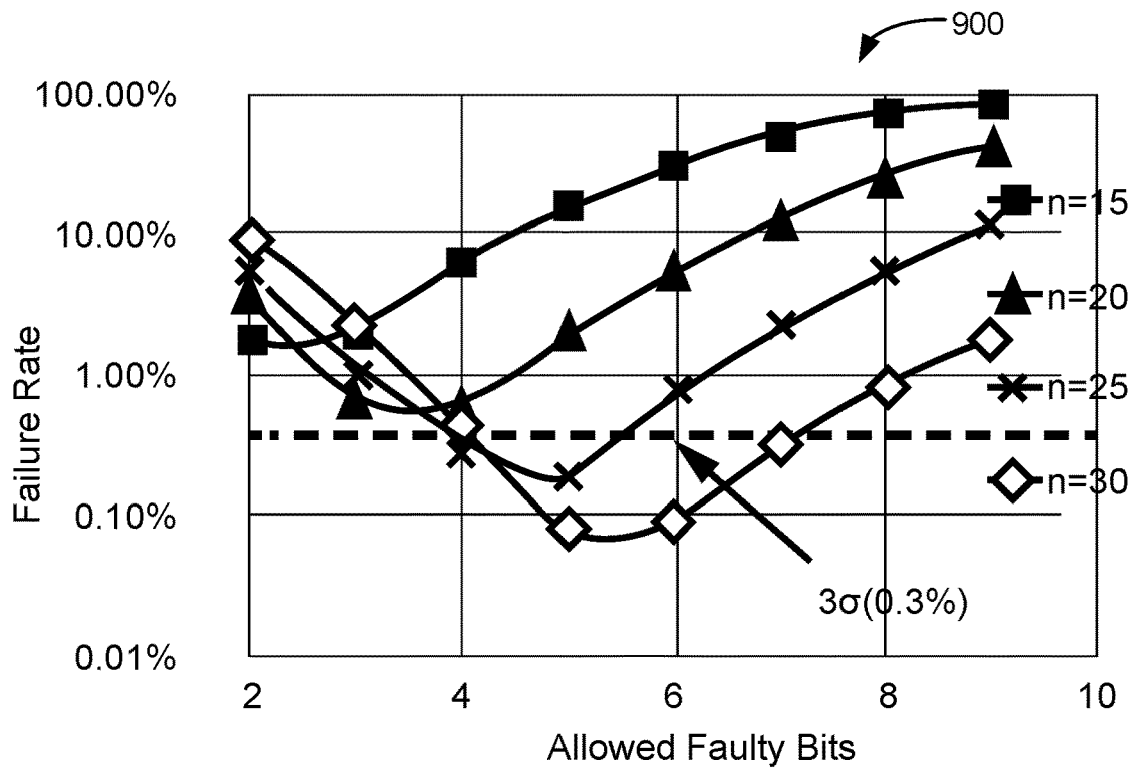
FIG. 9 is a graph illustrating total failure rate versus number of cells n.

FIG. 9 is a graph 900 illustrating total failure rate versus number of cells n. As the number of n increases, the failure rate from the missed chip drops, which shifts the optimum value of t higher and leads to a lower total failure rate. If a certain target yield is set, e.g. three sigma yield of 99.7%, the choices of n and t can be obtained from simulation as shown in FIG. 9. In the case, simulation shows an n of 22 and a t of 4 provide an optimum total failure rate of 0.3% satisfying the yield target.

Figure 10:
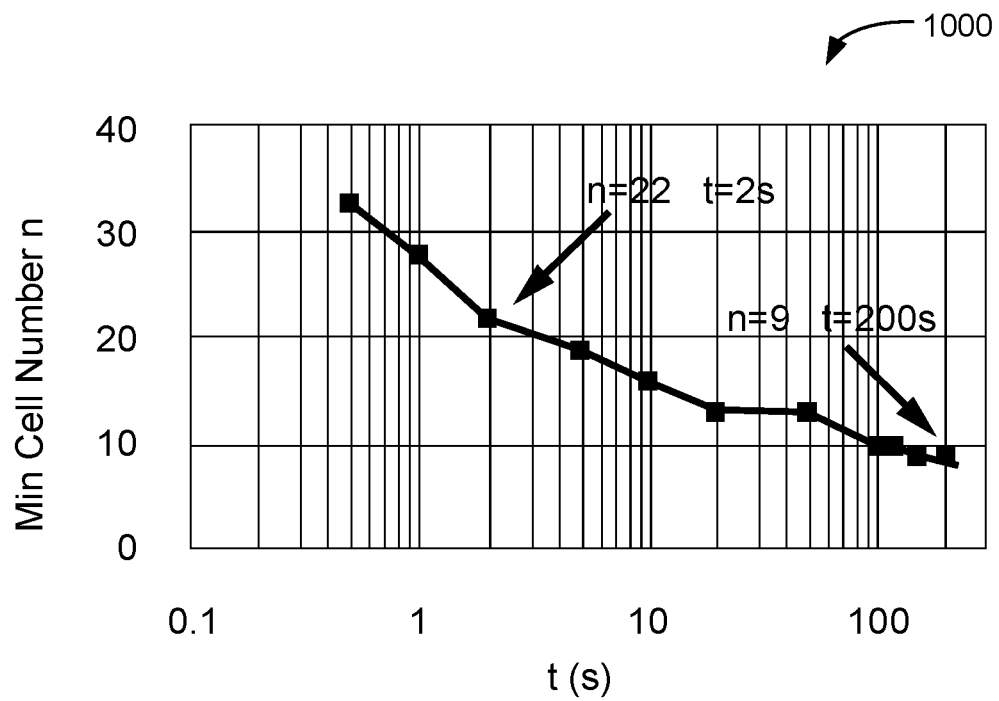
FIG. 10 is a graph illustrating example analytical results from equations above on the minimum numbers of cells to achieve a 3-sigma yield versus different stress time.

FIG. 10 is a graph 1000 illustrating example analytical results from equations above on the minimum numbers of cells to achieve a 3-sigma yield versus different stress time. It is shown that 22 cells are provided for 2 second stress while only 9 cells are provided for 200 seconds. Note that further increasing stress time will not reduce cell counts any longer because the failure rate is limited by the miss rate from a fresh chip, which gives a fundamental stochastic requirement independent of choices of device size, cell count, etc.

Figure 11:
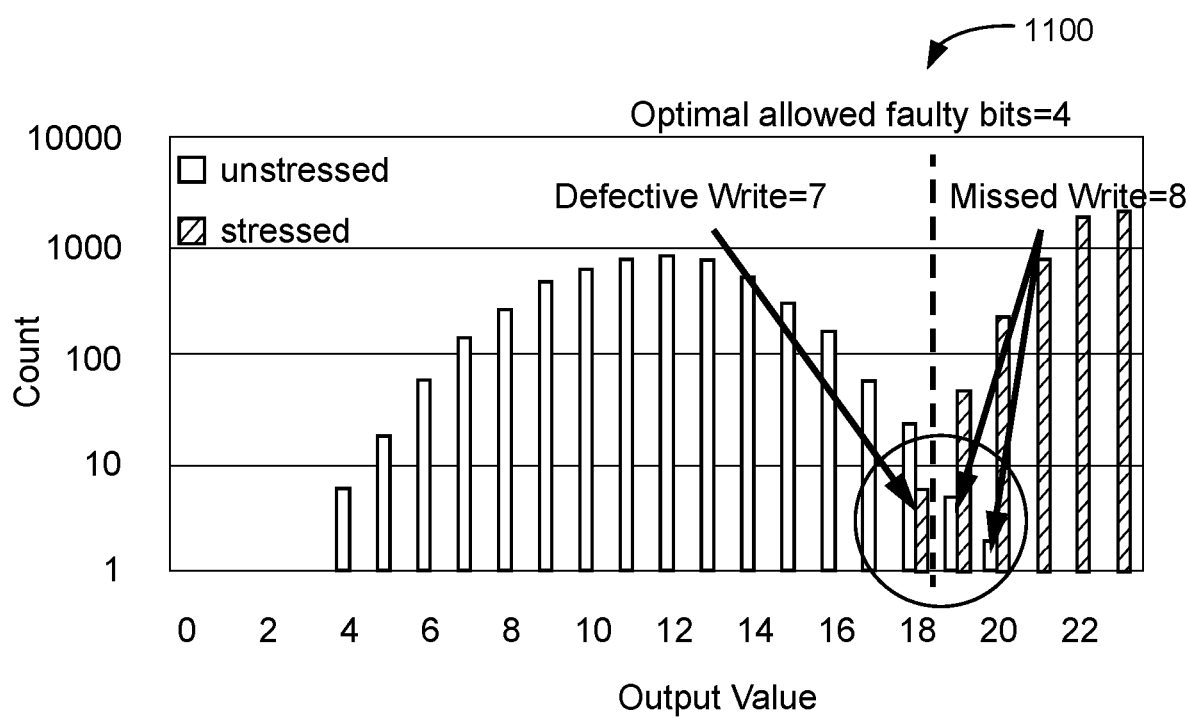
FIG. 11 is a chart of an example full-schematic simulation with 5000 chips verifying the analysis results with n=23 and stress time of 2 seconds.

FIG. 11 is a chart 1100 of an example full-schematic simulation with 5000 chips verifying the analysis results with n=23 and stress time of 2 seconds. A total failure rate of 0.3% is observed. The simulation can include a Monte-Carlo simulation. Twenty-three cells are used to achieve a yield of 0.3% for 2 seconds of stress time. Compared with analytical result, one more cell is needed most likely due to mismatch impact of unaccounted transistors in the schematic.

The area of the latch cell is estimated to be 11 μm2, which is about 15% larger than a standard cell flip-flop. The overall area of the silicon marker circuit is equally dominated by the latch cells and charge pump capacitors which are estimated to be about 25 latch cells. If multiple cell arrays are used, the size the charge pump generator becomes less significant as only one charge pump is needed for the whole chip. Thus, the size of the silicon marker circuit is determined by the numbers of latch cells needed based on the yield requirement. The overall power consumption is simulated to be about 25 μW. The design is highly scalable with technology and the hardware cost is expected to reduce further in more advanced technology where the aging effect becomes more pronounced.

Figure 12:
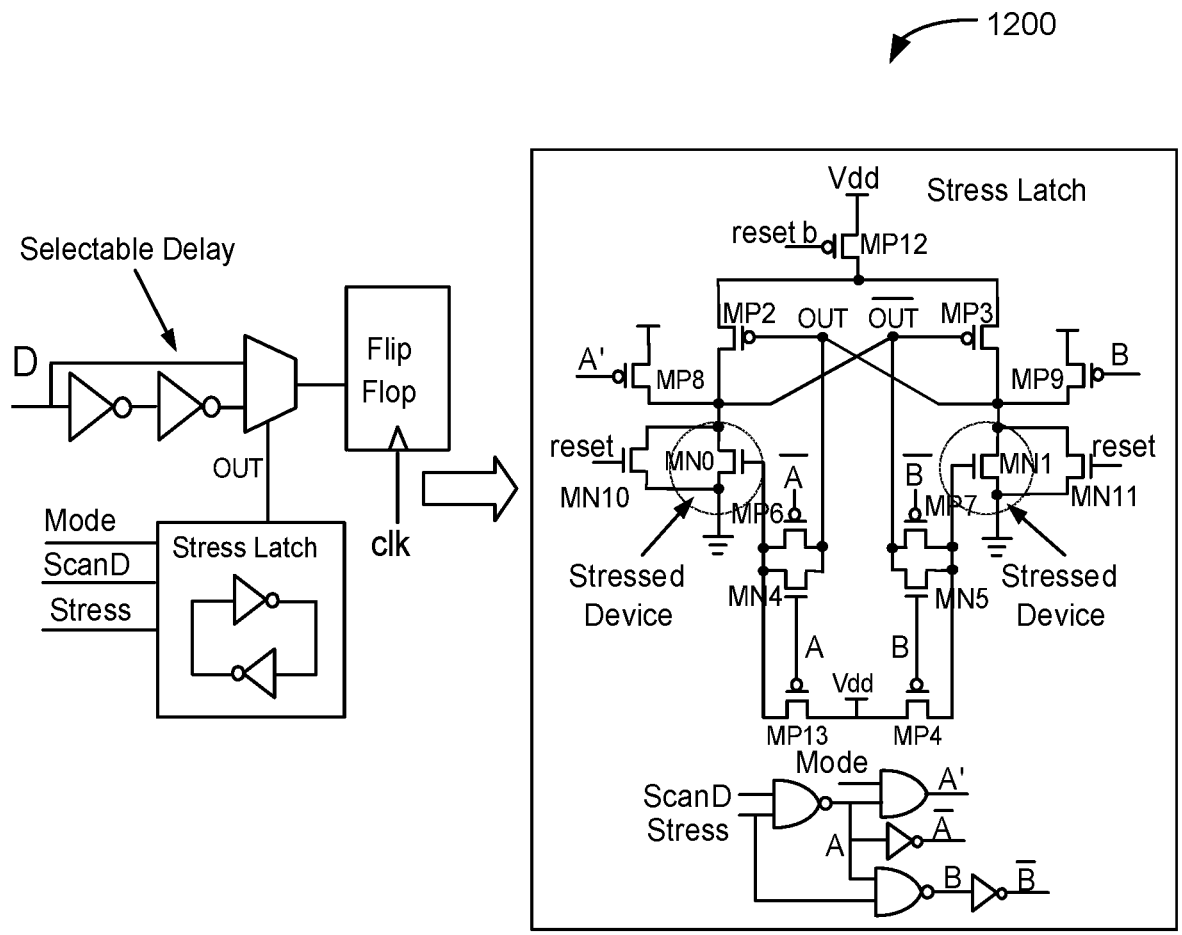
FIG. 12 is a circuit diagram of an example timing recovery circuit.

FIG. 12 is a circuit diagram of an example timing recovery circuit 1200. The timing recovery circuit 1200 includes a hold recovering flip-flop with additional stress latch. Using similar latch-based aging accelerating cell, the aging effect is used to recover timing violation, especially for hold timing which can be a function failure that cannot be recovered by adjusting the voltage or clock of the design. The hold timing violation is recovered by introducing extra delay in the circuit when such a violation is observed during production test. Extra difficulty can exist in the design of timing recovery circuit compared with previous applications. (1) The timing recovery circuit is highly sensitive to area overhead because the circuit needs to be embedded into the logic design with large numbers of instances. (2) High voltage used in previous scheme is not easy to be routed into individual gates at the heart of digital design. To resolve such stringent requirement, a latch-based timing recovery flip-flop design is illustrated using HCI effects rather than NBTI in previous session.

Based on model and observation above, a threshold voltage shift of around 10~20 mV can be introduced at around 1.4V elevated supply from nominal 1.1V supply for around 1~3 minutes stress in a typical production test time. The current is simulated to be around 1.5 mA. Therefore, the flip-flop circuit can recover from hold timing failure during production test where scan-based test can be used to screen the failed flip-flop. FIG. 12 shows the timing recovery flip-flop design for hold violation with its associated operation mode and internal node logic levels.

In the FIG. 12, the circuit includes a selectable additional delay paths and a stress latch which enables selection of the data delay of the flip-flop. By default, no additional delay is introduced controlled by the mode signal (=1) and if no timing violation is observed, no additional programming is needed. However, if a hold violation is observed during production test, one of the critical NMOS MN0 and MN1 is selectively stressed depending on whether a hold violation is detected. MP8 and MP9 are used to deliver stress current to the stressed transistor MN0 and MN1 and is normally turned off and thus does not contribute to the final output of the flip-flop. The programming through stressing of MN0 or MN1 determine the latch output value leading to the reconfigurable data path delay for the flip-flop. Similar to the above, transmission gate MP6/MP7 and MN4/MN5 are used to switch between stress mode and comparison mode. However the design is simpler because no high voltage is required during stress mode eliminating the need of generating high voltages as well as protection of supporting devices. After the stress, the mode signal is switched to 0 (timing recovery mode) and a long data delay can be generated on selected flip-flop to recover the hold violation. When a hold violation is observed, during stress mode, the selection of the stress device (MN0 or MN1) on a particular flip-flop is made from the ScanD signal using Scan Chain which is typically available in a digital design. The stress period is enabled by enabling the global "stress" control signal and raise the Vdd to 30% higher for 1 to 3 minutes. After the latch is programed, the flip-flop has a data path delay based on programmed value leading to a permanent improvement of the hold timing on selected. A hold timing increase of 70-100 ps can be created using two long delay inverters as shown in FIG. 12.

As the introduced aging of the device has to overcome the random mismatch of the internal circuits and only single cell can be used due to area constraint, large size of the stressed device has to be used to overcome the impact of random mismatch different from previous design where multiple instances of accelerator cells can be utilized. Thus an analysis on tradeoff between area overhead and yield is performed below.

Focusing on the threshold voltage, the following equation provides a condition for successful programming, e.g., the introduced Vth shift has to be larger than the combination of the random Vth variation of all the devices.

$$\Delta V_{th} > \text{SUM}(\Delta V_{th0}, \Delta V_{th1}, S_2 \times \Delta V_{th2}, S_3 \times \Delta V_{th3} \ldots) \qquad (8)$$

where $\Delta V_{th0}$ and $\Delta V_{th1}$ are the threshold voltage variation of the main NMOS MN0 and MN1, and the rest are the threshold voltages of other supporting devices MP2, MP3, etc. $S_2$, $S_3$, ... refer to the sensitivity of the transistors to the latch output relative to MN0 and MN1. The sensitivity of all the supporting devices is maintained low (S<0.2) using similar strategy as in section 3 so that the overall impacts are determined only by the mismatch of the MN0 and MN1. Because mismatch is inversely proportional to the square root of the areas of the transistors based on Pelgrom's law, equation (9) shows the variation with the areas of each devices.

$$\Delta V_{th}^2 > 2 \times \left[ \left( \frac{\beta \sigma_{min}}{\sqrt{\frac{A_{0,1}}{A_{min}}}} \right)^2 + \left( S_2 \frac{\beta \sigma_{min}}{\sqrt{\frac{A_{2,3}}{A_{min}}}} \right)^2 + \left( S_4 \frac{\beta \sigma_{min}}{\sqrt{\frac{A_{4,5}}{A_{min}}}} \right)^2 + \ldots \right] \qquad (9)$$

where $\sigma_{min}$ and $A_{min}$ are the standard deviation of the threshold voltage for minimum size transistor in the technology. $\beta$ is the target yield in term of number of standard deviation, e.g. 3 for 99.85%. $A_{0,1}$ $A_{2,3}$ $A_{4,5}$ are the device areas for the transistors MN0/MN1, PM2/PM3, MN4/MN5, etc. where only MN0/MN1 dominates the final results. Ignoring the contribution from other devices, the sizes of MN0 and MN1 can be mathematically calculated using equation (10).

$$A_{0,1} > A_{min} \frac{2\beta^2 \sigma_{min}^2}{\Delta V_{th}^2} \qquad (10)$$

Finally, the final timing recovery successful rate (SR) is ready to be calculated by equation (11):

$$SR = \Phi(\beta)^n \qquad (11)$$

where $\Phi$ is the cumulative distribution function (CDF) of normal distribution, $\beta$ is the number of sigma of variation from equation (9) and n is the number of flip-flops showing failure on the chip. Note that if multiple flip-flops experience timing failure, all of them need to be reconfigured successfully to recover the chip yield. As a result, the successful rate drops with the number of failed flip-flops. Equation (10) and (11) can be verified from the circuit level Monte-Carlo simulation in Cadence Virtuoso using 10,000 points.

As a case study on the overall area overhead of the scheme as well as its yield impact, design can be perfomred on a pipelined FFT processor in 45 nm technology. Synthesis and place and route are performed using Cadence encounter. To observe potential hold issue, a relatively relaxed hold timing constraint (>0 ps) is used during synthesis without considering random local variation and clock skew. Table 2 shows the design specs as well as the area overhead of the flip-flop.

TABLE 2

Summary of Design Specifications.

| Area (mm2) | 0.14 | Power (mW) | 245.3 |
|---|---|---|---|
| Num. of Cells | 50,899 | Num. of Flops | 9046 |
| Num. of implemented flops | 200 | Chip Area Overhead | ≤0.85% |
| Area of Conventional Flip-flop | 6.5 μm2 | Area of Recovery Flip-flop | 10.4~12.7 μm2 |

Out of 9,000 flip-flops in the original design, about 200 of them show a tight hold margin and were converted into the hold recovering flops. A spice level Monte-Carlos simulation can be performed on all the hold critical paths on the 200 flip-flops to add local variation and clock skew into consideration. As a result, about 10 flip-flops experience hold violations. Using the timing recovery flip-flop, the timing failure can be recovered while in the conventional scenario, a significant yield loss may have occurred. The area overhead of the flip-flop can be evaluated in the context of the whole FFT processor design.

Figure 13A:
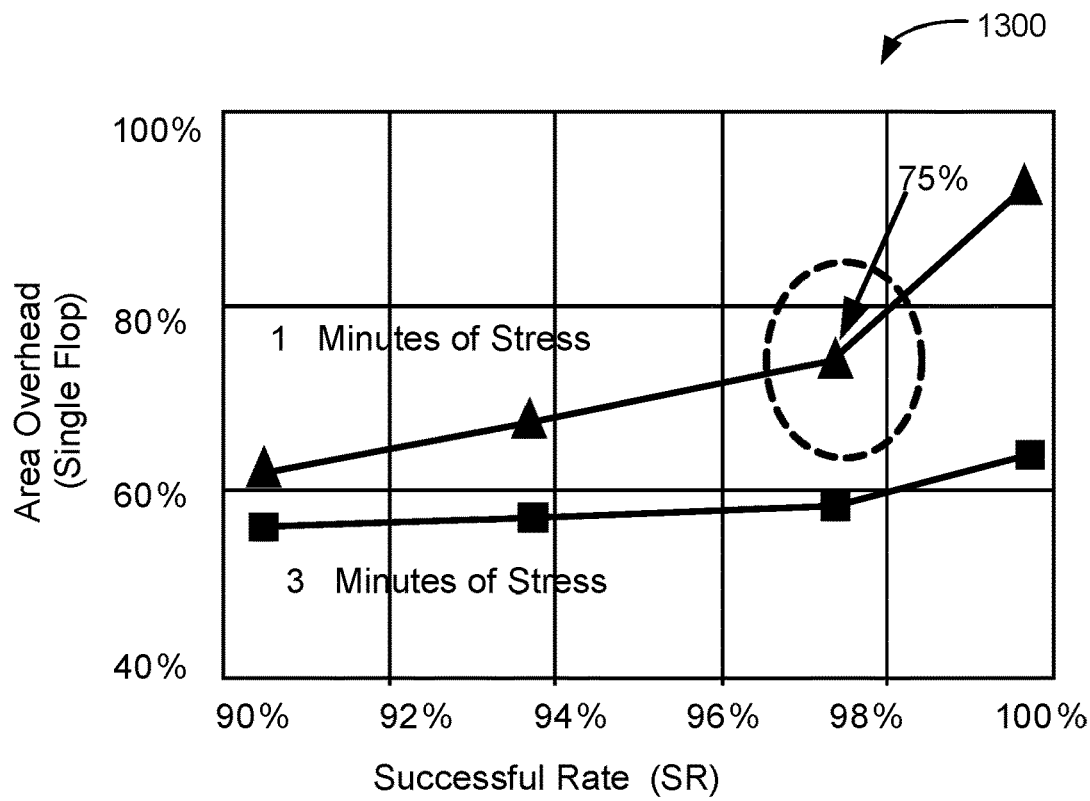
FIGS. 13A and 13B are graphs of an example area overhead versus successful rate of the hold recovering flip-flop for: (a) overhead of the single flop; (b) chip overhead.
Figure 13B:
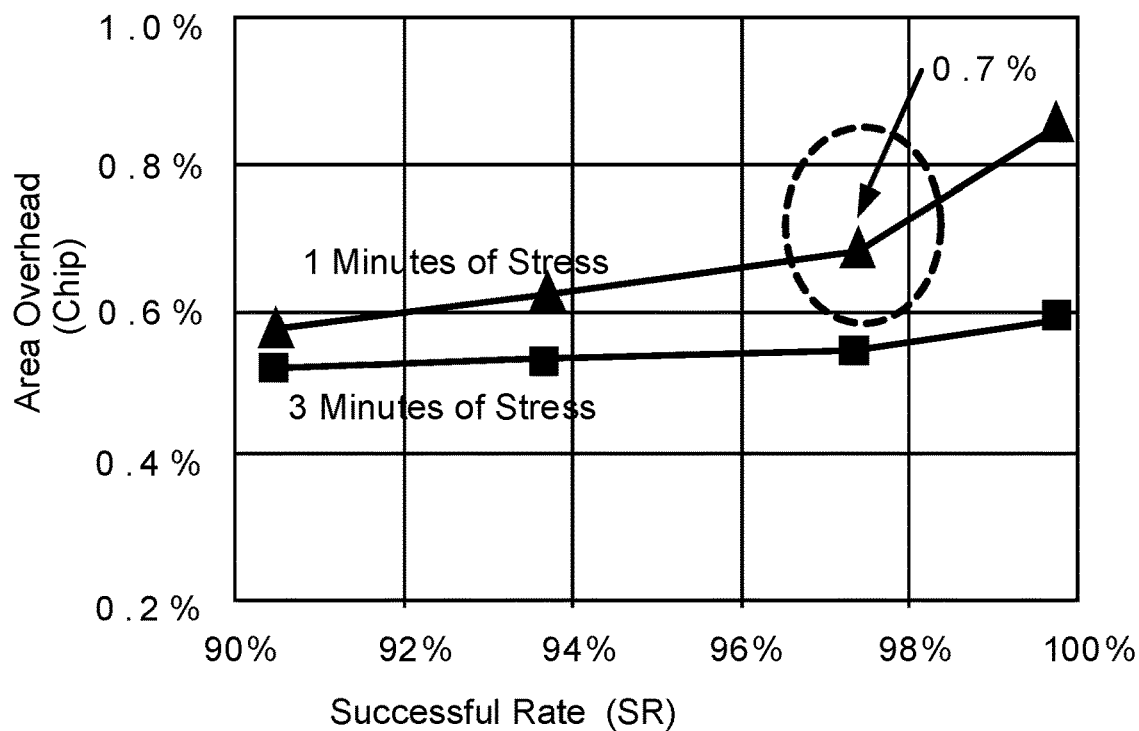

FIGS. 13A and 13B are graphs of an example area overhead versus successful rate of the hold recovering flip-flop for: (a) overhead of the single flop; (b) chip overhead. FIG. 13(a) shows the results on the area overhead using the hold recovering flip-flop versus successful rate of timing recovery. The flip-flop area overhead increases with higher successful rate and less stress time due to larger device sizes to overcome the mismatch. For instance, to achieve 97% successful rate with 3 minutes of stress, 75% area overhead is built into single flip-flop design based on conventional scan enabled set/reset flip-flops. FIG. 13B shows the overall chip area overhead versus successful rate for timing recovery. Due to the small number of converted flip-flops, the overall chip overhead as shown is only 0.7%, while the loss of yield due to timing failure has been reduced by 97% using the timing recovery design.

Conclusions

As hardware security and online configurability is becoming a critical requirement in a modern IC design, an accurate and cost efficient silicon tracking circuit can be desirable. The description includes a silicon usage marker circuit, e.g., using only conventional CMOS devices. By applying both device level and system level acceleration technique, the aging effect based on NBTI is enhanced to create distinguishable marker of the IC usage with tolerance of process variation. The stochastic based processing and design technique is described to improve the successful rate of the marker creation. The circuits can be designed in a 45 nm CMOS technology with Monte-Carlo simulation to verify the functionality and effectiveness of the described scheme. Results show that it is possible to achieve a high confident tracking within a few seconds in contrast with previous reported days of operation. Simulation also shows that the system only consumes 25 μW power. The design is self-contained and the size of building elements of the described silicon marker circuits is compatible with conventional standard cell leading to an easy implementation as an embedded IP.

The systems and methods described above may be implemented in many different ways in many different combinations of hardware, software firmware, or any combination thereof. In one example, the systems and methods can be implemented with a processor and a memory, where the memory stores instructions, which when executed by the processor, causes the processor to perform the systems and methods. The processor may mean any type of circuit such as, but not limited to, a microprocessor, a microcontroller, a graphics processor, a digital signal processor, or another processor. The processor may also be implemented with discrete logic or components, or a combination of other types of analog or digital circuitry, combined on a single integrated circuit or distributed among multiple integrated circuits. All or part of the logic described above may be implemented as instructions for execution by the processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. A product, such as a computer program product, may include a storage medium and computer readable instructions stored on the medium, which when executed in an endpoint, computer system, or other device, cause the device to perform operations according to any of the description above. The memory can be implemented with one or more hard drives, and/or one or more drives that handle removable media, such as diskettes, compact disks (CDs), digital video disks (DVDs), flash memory keys, and other removable media.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it can be apparent that many more embodiments and implementations are possible. Accordingly, the embodiments are not to be restricted.

We claim:
1. A system, comprising:
an aging accelerating circuit, the aging accelerating circuit to create a silicon marker during real-time operation to aid in determining a usage of a chip, wherein the aging accelerating circuit comprises a target aging transistor and supportive transistors, wherein the supportive transistors comprise transmission gates coupled to the target aging transistor, wherein, during a stress phase of the aging accelerating circuit, the transmission gates are configured to isolate the target aging transistor from the supportive transistors and the supportive transistors are configured to operate without overstress wherein the aging accelerating circuit transitions from the stress phase to a comparison phase, and enters a sleep phase after the comparison phase to provide aging protection to the aging accelerating circuit.

2. The system of claim 1, wherein the supportive transistors comprise complementary metal oxide semiconductor devices.

3. The system of claim 1, where the real-time operation comprises creating a silicon marker within a few seconds of operation.

4. The system of claim 1, further comprising a level shifter circuit connected with the aging accelerating circuit to provide an elevated target voltage during the stress phase.

5. The system of claim 4, wherein the level shifter circuit further provides a balanced power to the age accelerating circuit during the comparison phase.

6. The system of claim 5, further comprising a latch based comparator circuit to detect an aging of the chip.

7. The system of claim 6, wherein the balanced power comprises a virtual ground of the latch based comparator circuit is lifted to an internal voltage.

8. The system of claim 1, further comprising a silicon marker circuit connected with the aging accelerating circuit, where a size of the silicon marker circuit is determined by a number of latch cells needed based on a yield.

9. The system of claim 8, wherein the latch cells are staggered to eliminate interference through power supply among the latch cells during comparison.

10. The system of claim 1, further comprising a latch based comparator circuit to provide a stochastic output to detect an aging of the chip.

11. A method comprising:
creating a silicon marker to determine aging of stressed chips during real-time operation within only a few seconds of operation;
providing, during a stress phase when determining aging of the stressed chips, an elevated target voltage to an age accelerating circuit, wherein the age accelerating circuit comprises a target aging transistor and supportive transistors, wherein the supportive transistors comprise transmission gates coupled to the target aging transistor, wherein, during the stress phase, the transmission gates are configured to isolate the target aging transistor from the supportive transistors and the supportive transistors are configured to operate without overstress, wherein the aging accelerating circuit transitions from the stress phase to a comparison phase, and enters a sleep phase after the comparison phase to provide aging protection to the aging accelerating circuit; and
performing stochastic processing to ensure a detection accuracy of stressed chips within tolerance to process variation.

12. The method of claim 11, wherein for a chosen number of n cells of the stressed chips, the failure contribution from missed cells and defective cells show an opposite trend leading to an optimum solution for the value of t.

13. The method of claim 12, wherein the n cells of the stressed chips display a uniform output indicating a stressed situation and a random output indicating an unstressed situation.

14. The method of claim 11, further comprising providing a balanced power to the age accelerating circuit during the comparison phase.

15. The method of claim 14, wherein the balanced power comprises lifting an internal voltage of a virtual ground of a latch based comparator circuit.

16. The method of claim 15, wherein the latch based comparator circuit provides a stochastic output to determine the aging of the stressed chip.

17. The method of claim 16, further comprising staggering latch cells to eliminate power supply interference.

* * * * *